(12) United States Patent
Campbell et al.

(10) Patent No.: US 9,025,332 B2
(45) Date of Patent: May 5, 2015

(54) INLET-AIR-COOLING DOOR ASSEMBLY FOR AN ELECTRONICS RACK

(71) Applicant: International Business Machines Corporation, Armonk, NY (US)

(72) Inventors: Levi A. Campbell, Poughkeepsie, NY (US); Richard C. Chu, Hopewell Junction, NY (US); Milnes P. David, Fishkill, NY (US); Michael J. Ellsworth, Jr., Lagrangeville, NY (US); Roger R. Schmidt, Poughkeepsie, NY (US); Robert E. Simons, Poughkeepsie, NY (US); Daniel E. Zambrano, Weston, FL (US)

(73) Assignee: International Business Machines Corporation, Armonk, NY (US)

( * ) Notice: Subject to any disclaimer, the term of this patent is extended or adjusted under 35 U.S.C. 154(b) by 145 days.

(21) Appl. No.: 13/782,020

(22) Filed: Mar. 1, 2013

(65) Prior Publication Data
US 2014/0131008 A1 May 15, 2014

Related U.S. Application Data

(63) Continuation of application No. 13/674,217, filed on Nov. 12, 2012.

(51) Int. Cl.
*H05K 7/20* (2006.01)
*F28D 15/00* (2006.01)
*F28F 9/00* (2006.01)

(52) U.S. Cl.
CPC . *F28D 15/00* (2013.01); *F28F 9/00* (2013.01); *H05K 7/2079* (2013.01); *H05K 7/20827* (2013.01)

(58) Field of Classification Search
USPC ............... 361/676–678, 679.46–679.54, 361/688–722, 752, 760, 831
See application file for complete search history.

(56) References Cited

U.S. PATENT DOCUMENTS

| 4,011,905 | A | 3/1977 | Millard |
|---|---|---|---|
| 5,467,250 | A | 11/1995 | Howard et al. |

(Continued)

FOREIGN PATENT DOCUMENTS

| JP | 2012-177959 A | 9/2012 |
|---|---|---|
| WO | WO/2012009460 A2 | 1/2012 |
| WO | WO/2012118554 A1 | 9/2012 |

OTHER PUBLICATIONS

"RackCooler—A Cool Solution for X-Treme Density Rack Enclosure Systems," Liebert Corporation, Product Brochure, 8 pgs. (2001).

(Continued)

*Primary Examiner* — Courtney Smith
(74) *Attorney, Agent, or Firm* — Steven Chiu, Esq.; Kevin P. Radigan, Esq.; Heslin Rothenberg Farley & Mesiti P.C.

(57) ABSTRACT

A method is provided which includes providing a cooling apparatus for an electronics rack which includes a door assembly configured to couple to an air inlet side of the electronics rack. The door assembly includes: one or more airflow openings facilitating passage of airflow through the door assembly and into the electronics rack; one or more air-to-coolant heat exchangers disposed so that airflow through the airflow opening(s) passes across the heat exchanger(s), which is configured to extract heat from airflow passing thereacross; and one or more airflow redistributors disposed in a direction of airflow through the airflow opening(s) downstream of, and at least partially aligned to, the heat exchanger(s). The airflow redistributor(s) facilitates redistribution of the airflow passing across the air-to-liquid heat exchanger(s) to a desired airflow pattern at the air inlet side of the electronics rack, such as a uniform airflow distribution across the air inlet side of the rack.

13 Claims, 13 Drawing Sheets

(56) References Cited

U.S. PATENT DOCUMENTS

| | | | |
|---|---|---|---|
| 6,164,369 A | 12/2000 | Stoller | |
| 6,462,944 B1 | 10/2002 | Lin | |
| 6,535,382 B2 | 3/2003 | Bishop et al. | |
| 6,760,221 B2 | 7/2004 | Goth et al. | |
| 6,775,137 B2 | 8/2004 | Chu et al. | |
| 6,819,563 B1 | 11/2004 | Chu et al. | |
| 7,086,247 B2 | 8/2006 | Campbell et al. | |
| 7,385,810 B2 | 6/2008 | Chu et al. | |
| 7,450,385 B1 * | 11/2008 | Campbell et al. | 361/699 |
| 7,646,603 B2 | 1/2010 | Bard et al. | |
| 7,660,116 B2 | 2/2010 | Claassen et al. | |
| 7,746,634 B2 | 6/2010 | Hom et al. | |
| 7,830,657 B2 | 11/2010 | Chu et al. | |
| 7,832,925 B2 | 11/2010 | Archibald et al. | |
| 7,990,709 B2 | 8/2011 | Campbell et al. | |
| 8,077,462 B2 * | 12/2011 | Barringer et al. | 361/700 |
| 8,139,354 B2 | 3/2012 | June et al. | |
| 8,144,925 B2 | 3/2012 | Campbell et al. | |
| 8,171,986 B2 | 5/2012 | Klein | |
| 8,250,877 B2 | 8/2012 | Correa et al. | |
| 8,274,790 B2 | 9/2012 | Campbell et al. | |
| 8,351,206 B2 * | 1/2013 | Campbell et al. | 361/700 |
| 8,789,384 B2 | 7/2014 | Eckberg et al. | |
| 8,804,334 B2 | 8/2014 | Eckberg et al. | |
| 2004/0177948 A1 | 9/2004 | Cho et al. | |
| 2005/0231913 A1 | 10/2005 | Malone et al. | |
| 2006/0026983 A1 * | 2/2006 | Tilton et al. | 62/310 |
| 2006/0232945 A1 * | 10/2006 | Chu et al. | 361/724 |
| 2011/0067948 A1 | 3/2011 | Bard | |
| 2011/0094714 A1 | 4/2011 | Day | |
| 2012/0186790 A1 | 7/2012 | Delia et al. | |
| 2013/0105122 A1 * | 5/2013 | Campbell et al. | 165/104.26 |
| 2014/0133098 A1 | 5/2014 | Campbell et al. | |

OTHER PUBLICATIONS

Teague, Paul E., "One Cool Machine," Design News for Mechanical and Design Engineers, Internet Article, 6 pgs., (Feb. 7, 2005).

Campbell et al., "Inlet-Air-Cooling Door Assembly for an Electronics Rack", U.S. Appl. No. 13/674,217, filed Nov. 12, 2012.

Campbell et al., Office Action for U.S. Appl. No. 13/674,217, filed Nov. 12, 2012 (U.S. Patent Publication No. 2014/0133098 A1), dated Oct. 2, 2014 (14 pages).

* cited by examiner

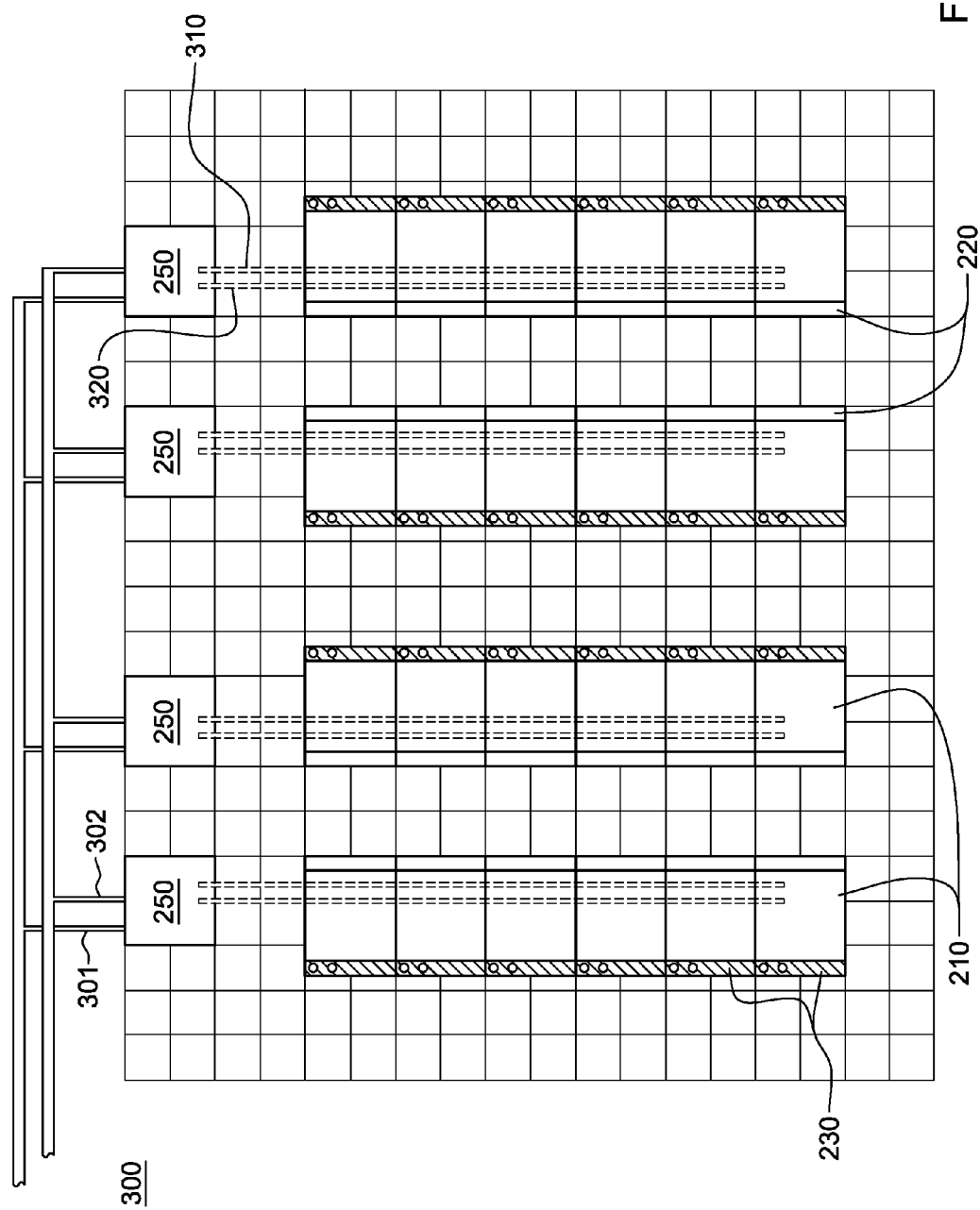

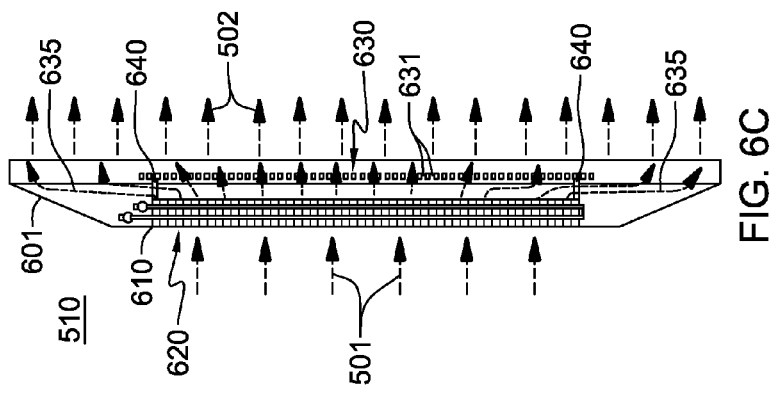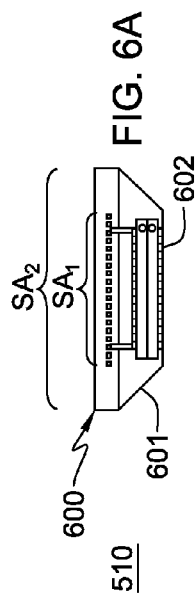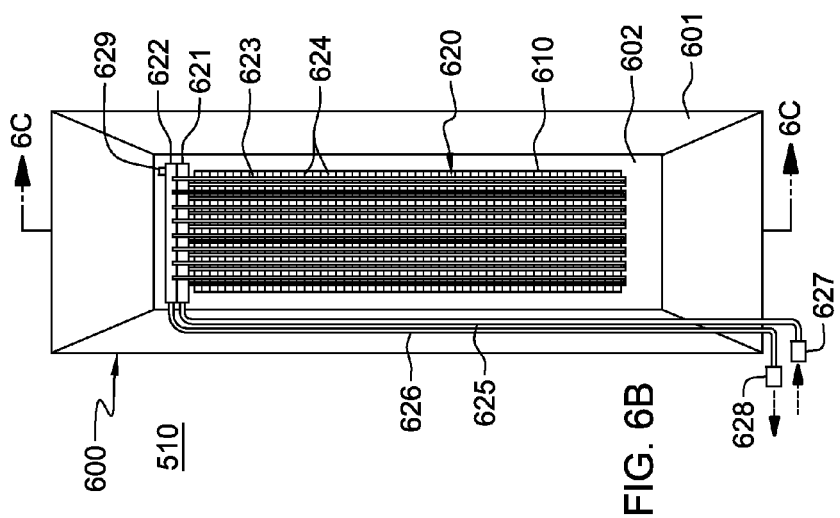

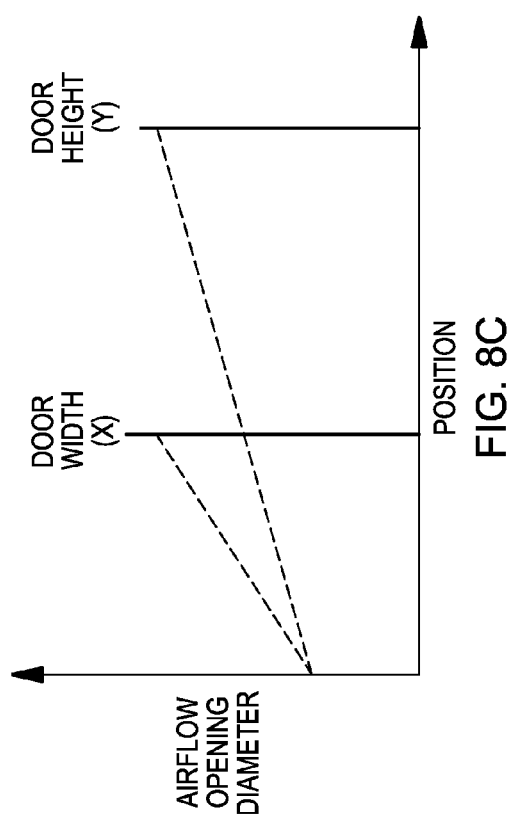
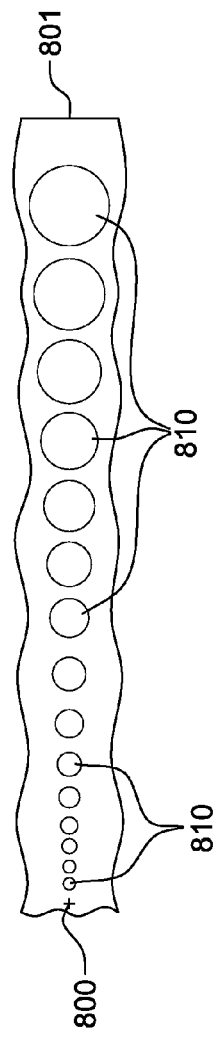
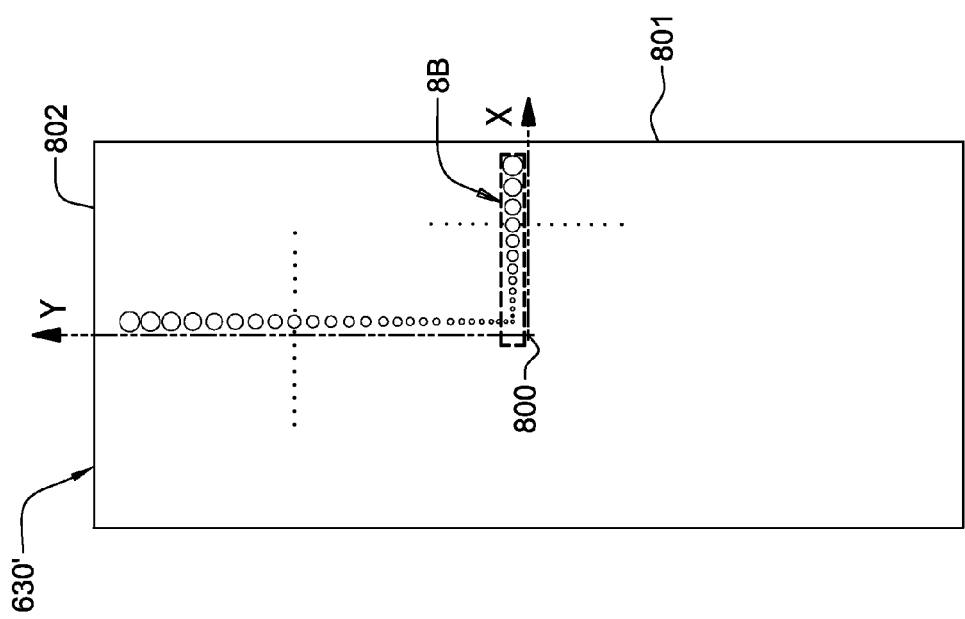
FIG. 8A
FIG. 8B
FIG. 8C

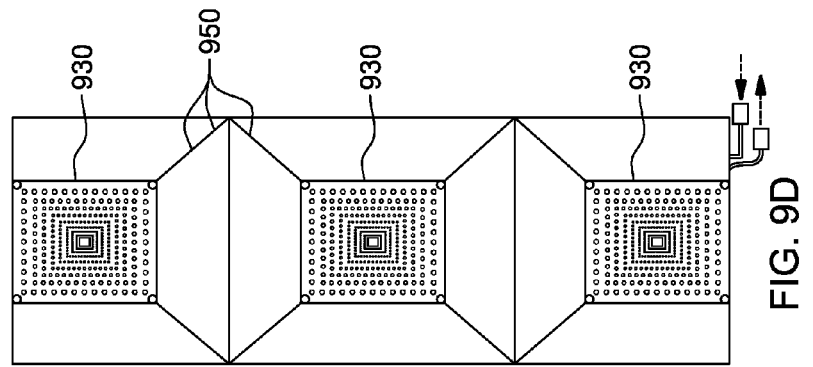
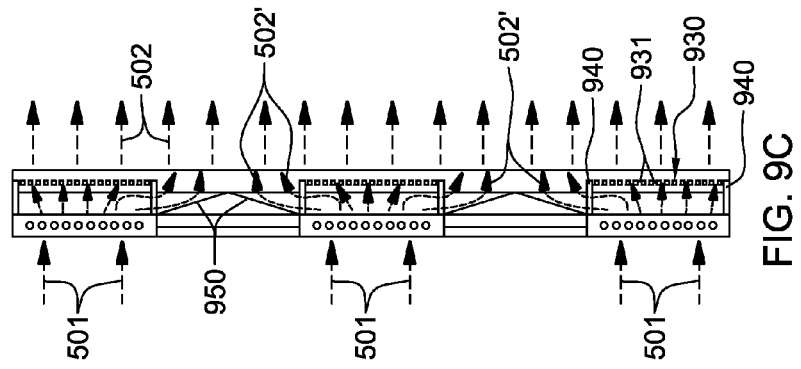
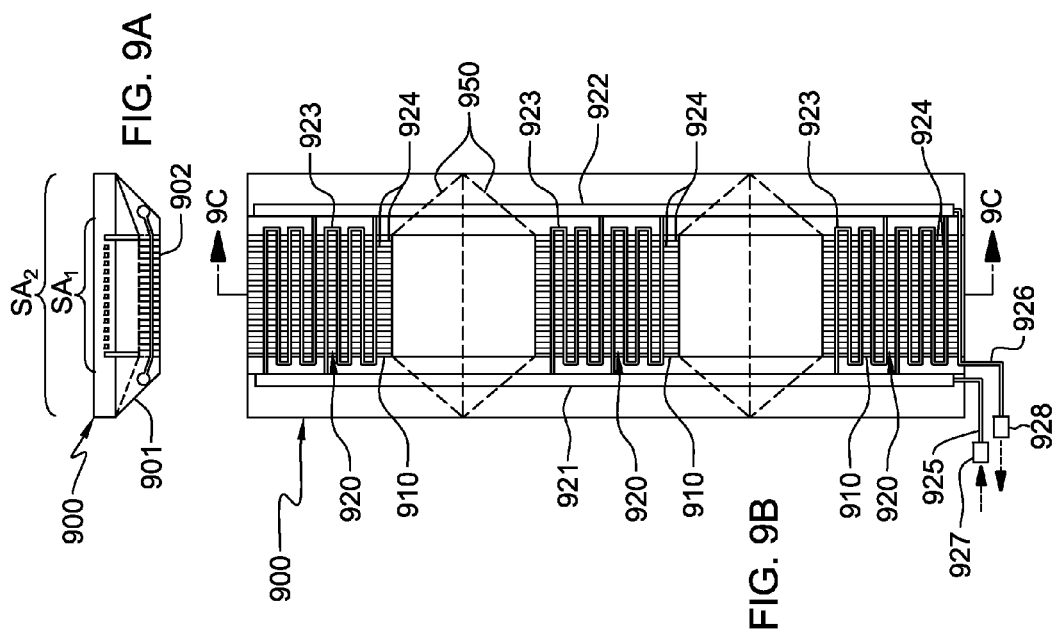

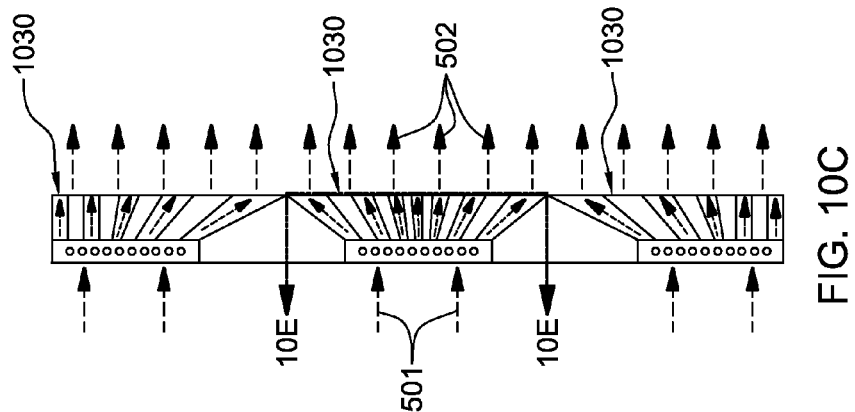
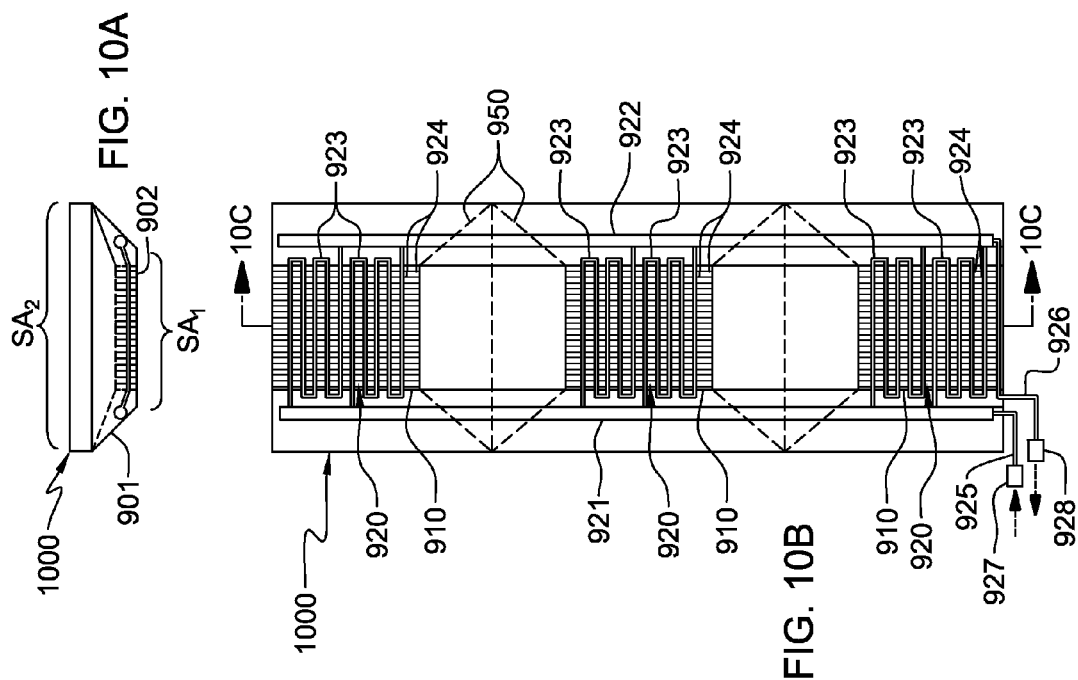

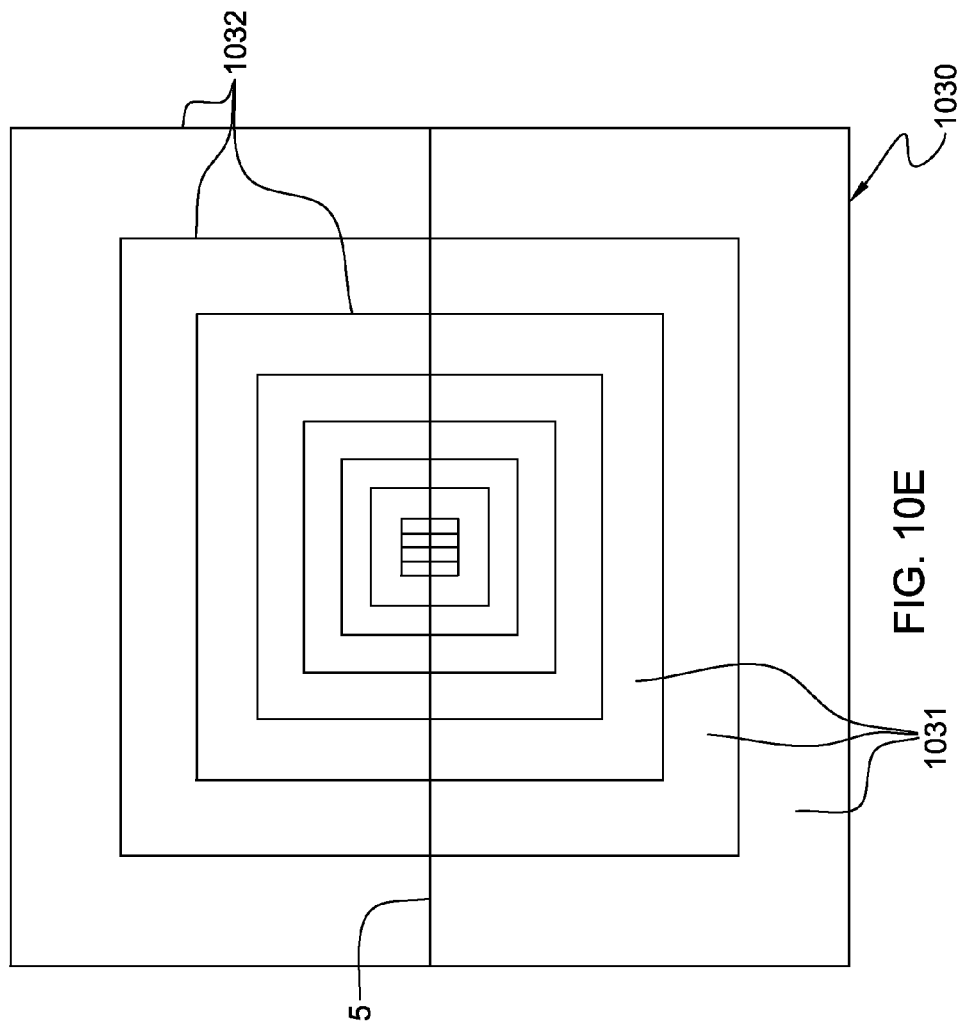
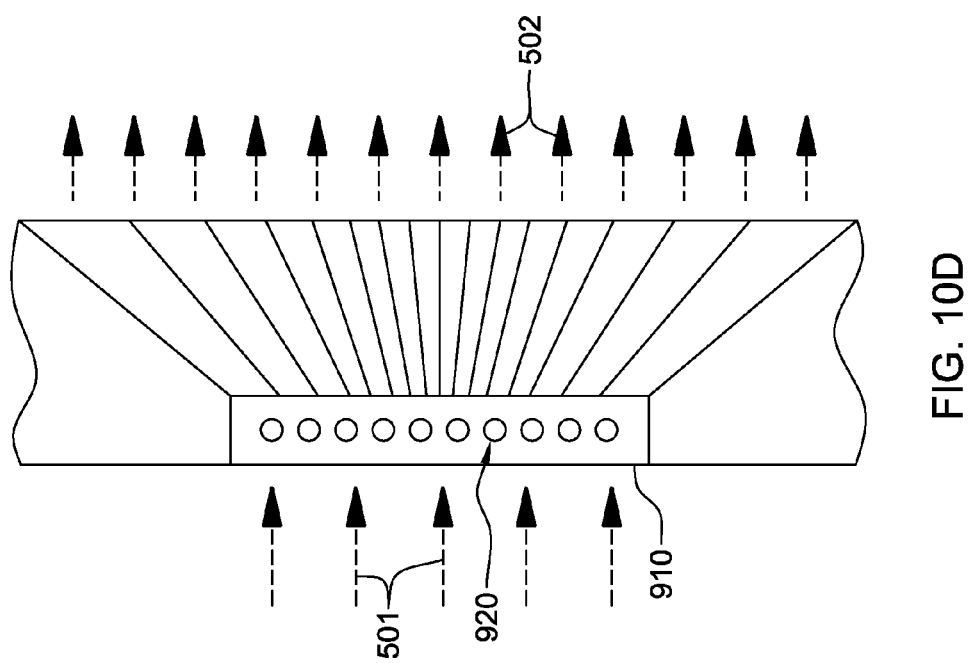
FIG. 10D
FIG. 10E

INLET-AIR-COOLING DOOR ASSEMBLY FOR AN ELECTRONICS RACK

CROSS-REFERENCE TO RELATED APPLICATION

This application is a continuation of U.S. Ser. No. 13/674, 217, filed Nov. 12, 2012, and entitled "Inlet-Air-Cooling Door Assembly for an Electronics Rack", and which is hereby incorporated herein by reference in its entirety.

BACKGROUND

The power dissipation of integrated circuit chips, and the modules containing the chips, continues to increase in order to achieve increases in processor performance. This trend poses a cooling challenge at both module and system levels. Increased airflow rates are needed to effectively cool high-powered modules, and to limit the temperature of the air that is exhausted into the computer center.

In many large server applications, processors, along with their associated electronics (e.g., memory, disk drives, power supplies, etc.), are packaged in removable drawer configurations stacked within a rack or frame. In other cases, the electronics may be in fixed locations within the rack or frame. Typically, the components are cooled by air moving in parallel airflow paths, usually front-to-back, impelled by one or more air-moving devices (e.g., fans or blowers). In some cases, it may be possible to handle increased power dissipation within a single drawer by providing greater airflow, through the use of a more powerful air-moving device, or by increasing the rotational speed (i.e., RPMs) of an existing air-moving device.

The sensible heat load carried by the air exiting the rack is stressing the capability of the room air-conditioning to effectively handle the load. This is especially true for large installations with "server farms", or large banks of computer racks close together. In such installations, liquid-cooling (e.g., water-cooling) is an attractive technology to manage the higher heat fluxes. The liquid facilitates removal of the heat dissipated by the components/modules in an efficient manner. Typically, the heat is ultimately transferred from the liquid to an outside environment.

BRIEF SUMMARY

In one aspect, certain shortcomings of the prior art are overcome and additional advantages are provided through a method which includes, for instance: providing a cooling apparatus comprising a door assembly configured to couple to an electronics rack and be disposed at an air inlet side of the electronics rack, wherein air moves through the electronics rack from the air inlet side to an air outlet side thereof, and wherein the door assembly facilitates air-cooling of one or more electronic components of the electronics rack. The door assembly includes: at least one airflow opening facilitating passage of airflow through the door assembly and into the electronics rack; at least one air-to-coolant heat exchanger disposed so that airflow through the at least one airflow opening passes across the at least one air-to-coolant heat exchanger, the at least one air-to-coolant heat exchanger being configured to extract heat from the airflow passing thereacross; and at least one airflow redistributor disposed in an airflow direction downstream of, and at least partially aligned to, the at least one air-to-coolant heat exchanger. The at least one airflow redistributor facilitates, at least partially, redistribution of the airflow passing across the at least one air-to-coolant heat exchanger, before reaching the air inlet side of the electronics rack.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 3 depicts one embodiment of a data center layout comprising multiple coolant distribution units providing coolant to a plurality of electronics racks with air-cooling apparatuses mounted to at least one of the air inlet sides or air outlet sides thereof, in accordance with one or more aspects of the present invention;

FIG. 6A is a top plan view of one embodiment of an inlet-air-cooling door assembly for mounting to an electronics rack and being disposed at the air inlet side thereof, in accordance with one or more aspects of the present invention;

FIG. 6B is a front elevational view of one embodiment of the inlet-air-cooling door assembly of FIG. 6A, in accordance with one or more aspects of the present invention;

FIG. 6C is a cross-sectional elevation view of the inlet-air-cooling door assembly of FIG. 6B, taken along line 6C-6C thereof, in accordance with one or more aspects of the present invention;

FIG. 8A depicts an alternate embodiment of an airflow redistributor for an inlet-air-cooling door assembly, in accordance with one or more aspects of the present invention;

FIG. 8B is a partial enlargement of the airflow redistributor of FIG. 8A, illustrating varying airflow opening diameters from a center to a periphery of the airflow redistributor, in accordance with one or more aspects of the present invention;

FIG. 8C is a graph of airflow opening diameter versus opening position from center, in both an x direction and a y direction, for one embodiment of the airflow redistributor of FIGS. 8A & 8B, and illustrating a different rate of change of the airflow opening diameters in the different directions, in accordance with one or more aspects of the present invention;

FIG. 9A is a top plan view of an alternate embodiment of an inlet-air-cooling door assembly for mounting to an electronics rack and being disposed at the air inlet side thereof, in accordance with one or more aspects of the present invention;

FIG. 9B is a front elevational view of one embodiment of the inlet-air-cooling door assembly of FIG. 9A, in accordance with one or more aspects of the present invention;

FIG. 9C is a cross-sectional elevation view of the inlet-air-cooling door assembly of FIG. 9B, taken along line 9C-9C thereof, in accordance with one or more aspects of the present invention;

FIG. 9D is a back elevational view of the inlet-air-cooling door assembly of FIGS. 9A-9C, in accordance with one or more aspects of the present invention;

FIG. 10A is a top plan view of another embodiment of an inlet-air-cooling door assembly for mounting to an electronics rack and being disposed at the air inlet side thereof, in accordance with one or more aspects of the present invention;

FIG. 10B is a front elevational depiction of one embodiment of the inlet-air-cooling door assembly of FIG. 10A, in accordance with one or more aspects of the present invention;

FIG. 10C is a cross-sectional elevation view of the inlet-air-cooling door assembly of FIG. 10B, taken along line 10C-10C thereof, in accordance with one or more aspects of the present invention;

FIG. 10D is a partially enlarged, cross-sectional elevation view of the inlet-air-cooling door assembly of FIGS. 10A-10C, and illustrating one embodiment of the airflow redistributors thereof, in accordance with one or more aspects of the present invention; and FIG. 10E is a back elevational view of the partially enlarged door assembly depiction of FIG. 10D, and illustrating further an airflow redistributor thereof, in accordance with one or more aspects of the present invention.

DETAILED DESCRIPTION

Figure 1A:
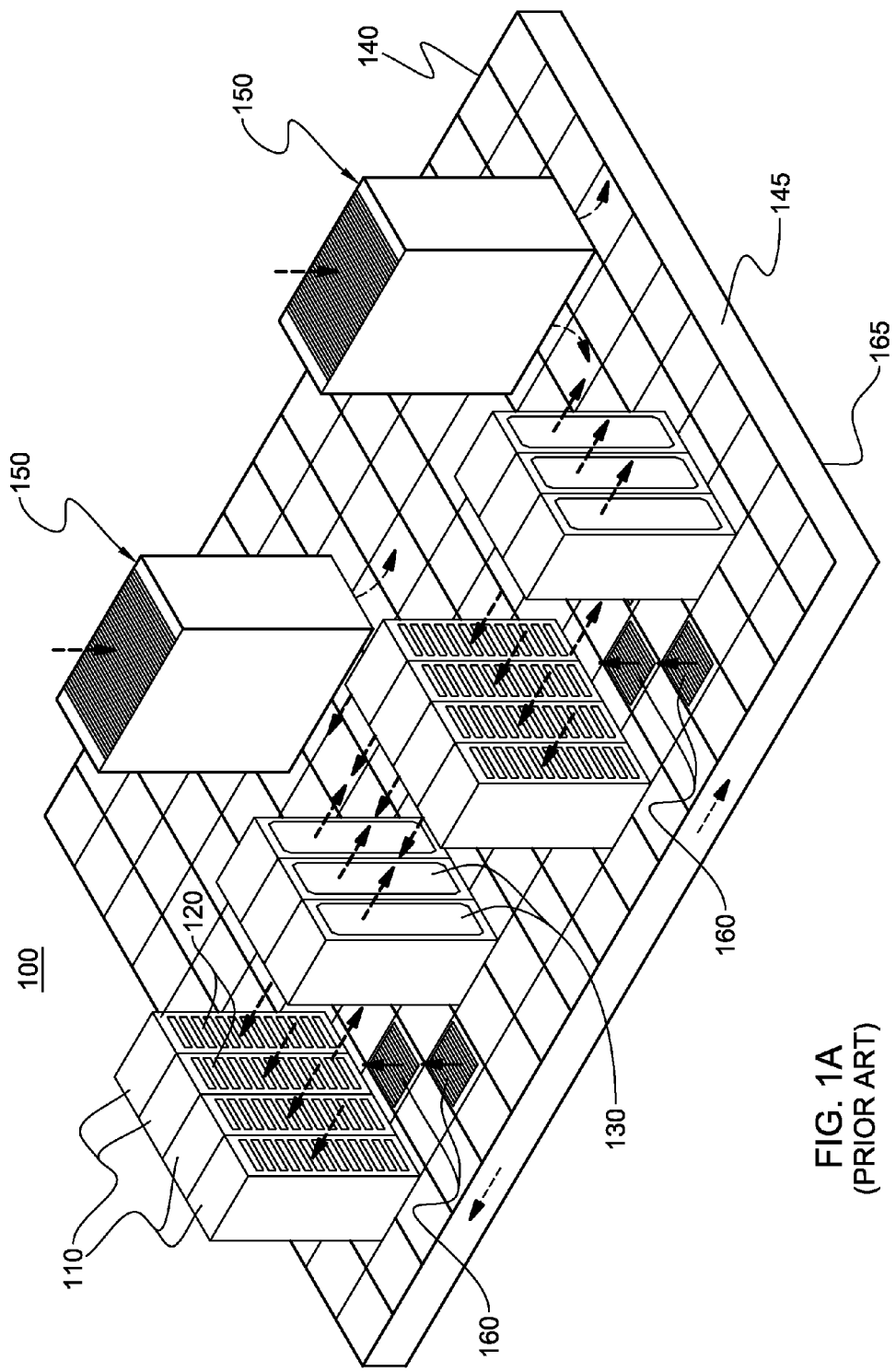
FIG. 1A depicts one embodiment of a conventional raised floor layout of a computer installation comprising multiple electronics racks.

As used herein, the terms "electronics rack", "rack unit", and "rack" are used interchangeably, and unless otherwise specified, include any housing, frame, support structure, compartment, blade server system, etc., having one or more heat generating components of a computer system or electronic system, and may be, for example, a stand-alone computer processor having high, mid or low end processing capability. In one embodiment, an electronics rack may comprise a portion of an electronic system, a single electronic system, or multiple electronic systems, for example, in one or more sub-housings, blades, books, drawers, nodes, compartments, etc., having one or more heat-generating electronic components disposed therein. An electronic system within an electronics rack may be movable or fixed relative to the electronics rack, with the rack-mounted electronic drawers of a multi-drawer rack unit and blades of a blade center system being two examples of systems (or subsystems) of an electronics rack to be cooled. By way of further example, an electronics rack may be, or may comprise, an information technology (IT) rack or frame.

Further, as used herein, "air-to-coolant heat exchanger" means any heat exchange mechanism or section characterized as described herein through which coolant can circulate; and includes, one or more discrete air-to-coolant heat exchangers or heat exchange sections coupled either in series or in parallel. An air-to-coolant heat exchanger may comprise, for example, one or more coolant flow paths, formed of thermally conductive tubings (such as copper or other tubing) in thermal or mechanical contact with a plurality of air-cooled cooling fins (such as aluminum or other fins). Unless otherwise specified, size, configuration and construction of the air-to-coolant heat exchanger can vary without departing from the scope of the invention disclosed herein. A "liquid-to-liquid heat exchanger" may comprise, for example, two or more coolant flow paths, formed of thermally conductive tubings (such as copper or other tubing) in thermal or mechanical contact with each other to facilitate conduction of heat therebetween. Size, configuration and construction of the liquid-to-liquid heat exchanger can vary without departing from the scope of the invention disclosed herein. Further, as used herein, "data center" refers to a computer installation containing one or more electronics racks, and as a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, and unless otherwise specified, one or more of the coolants may comprise a water-glycol mixture, a brine, a fluorocarbon liquid, a liquid metal, or other similar coolant, or a refrigerant, while still maintaining the advantages and unique features of the present invention. Further, the term "coolant" refers to any liquid or gas, or combination thereof, used to remove heat, in accordance with the structures and concepts disclosed herein.

Reference is made below to the drawings (which are not drawn to scale to facilitate an understanding of the invention), wherein the same reference numbers used throughout different figures designate the same or similar components.

As shown in FIG. 1A, in a raised floor layout of an air cooled computer installation or data center 100, multiple electronics racks 110 may be disposed in one or more rows. A computer installation such as depicted in FIG. 1A may house several hundred, or even several thousand processors. In the arrangement of FIG. 1A, chilled air enters the computer room via floor vents from a supply air plenum 145 defined between a raised floor 140 and a base or sub-floor 165 of the room. Cooled air is taken in through louvered covers at the front, or air inlet sides 120, of the electronics racks and expelled through the back, or air outlet sides 130, of the electronics racks. Each electronics rack 110 may have one or more air-moving devices (e.g., fans or blowers) to provide forced inlet-to-outlet airflow to cool the electronic components within the rack. Supply air plenum 145 provides conditioned and cooled air to the air-inlet sides of the electronics racks via perforated floor tiles 160 disposed (in one embodiment) in a "cold" air aisle of the data center. The conditioned and cooled air is supplied to plenum 145 by one or more air-conditioning units 150, which may also be disposed within data center 100.

Room air is taken into each air-conditioning unit 150 near an upper portion thereof. In the depicted embodiment, this room air comprises in part exhausted air from the "hot" air aisles of the data center defined by opposing air outlet sides 130 of the electronics racks 110.

Figure 1B:
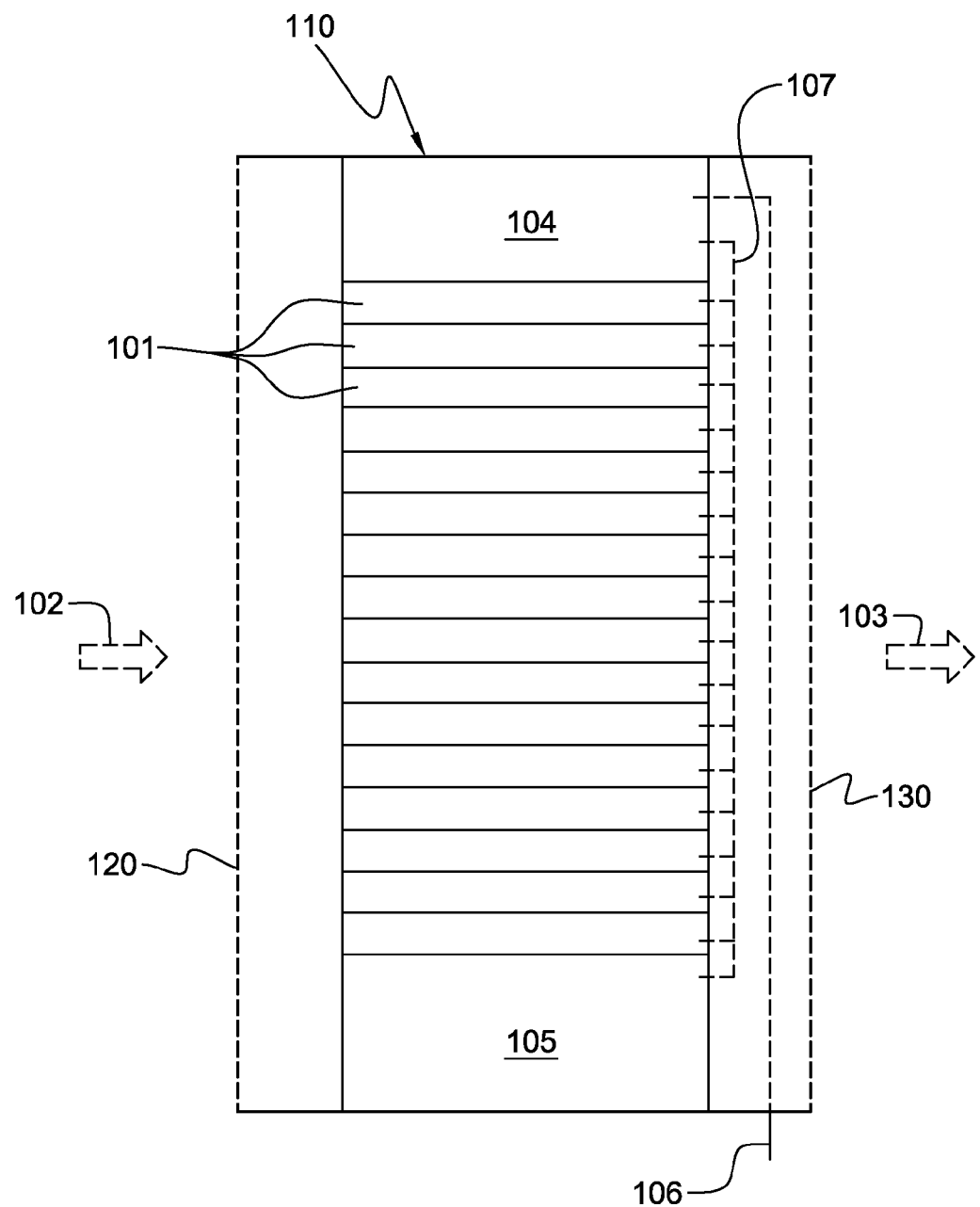
FIG. 1B is an elevational schematic of one embodiment of an electronics rack comprising multiple electronic systems or subsystems to be cooled, in accordance with one or more aspects of the present invention.

FIG. 1B is an elevational representation of one embodiment of an electronics rack 110. In the embodiment shown, electronics rack 110 includes a plurality of electronic subsystems 101, which (in the embodiment illustrated) are air-cooled by cool air 102 ingressing via louvered air inlet door 120, and exhausting out louvered air outlet door 130 as hot air 103. Electronics rack 110 also includes (in one embodiment) at least one bulk power assembly 104. One or more electronic subsystems 101 include, in one example, one or more processors, associated memory, input/output adapters and disk storage devices. Also illustrated in FIG. 1B is an I/O and disk expansion subsystem 105, which includes, in one detailed example, PCIe card slots and disk drivers for one or more electronic subsystems of the electronics rack. Note that I/O and disk expansion subsystem 105 could be disposed anywhere within electronics rack 110, with the positioning shown in FIG. 1B being provided as one example only. For example, the I/O and disk expansion subsystem 105 could alternatively be disposed in the middle of the electronics rack, if desired.

In one rack example, a three-phase AC source feeds power via an AC power cord 106 to bulk power assembly 104, which transforms the supplied AC power to an appropriate DC power level for output via distribution cables 107 to the plurality of electronics subsystems 101. AC power cord 106 supplies, in one example, three phase electrical power. The number and type of electronic subsystems installed in the electronics rack are variable and depend on customer requirements for a particular system.

Due to ever increasing airflow requirements through electronics racks, and the limits of air distribution within the typical computer room installation, recirculation problems within the room may occur. Recirculation can occur because the conditioned air supplied through the floor tiles may only be a fraction of the airflow rate forced through the electronics racks by the air moving devices disposed within the racks. This can be due, for example, to limitations on the tile sizes (or diffuser flow rates). The remaining fraction of the supply of inlet side air may be made up by ambient room air through recirculation, for example, from the air outlet side of the rack unit to the air inlet side. This recirculating flow is often very complex in nature, and can lead to significantly higher rack inlet temperatures than might be expected.

Recirculation of hot exhaust air from the hot aisle of the computer room installation to the cold aisle can be detrimental to the performance and reliability of the computer system(s) or electronic system(s) within the rack(s). Data center equipment is typically designed to operate with rack air inlet temperatures in the 15-35° C. range. For a raised floor layout such as depicted in FIG. 1A, however, temperatures can range from 15-20° C. at the lower portion of the rack, close to the cool air floor vents, to as much as 32-42° C. at the upper portion of the electronics rack, where hot air can form a self-sustaining recirculation loop. Since the allowable rack heat load is limited by the rack inlet air temperature at the "hot" part, this temperature distribution correlates to an inefficient utilization of available air conditioning capability. Computer installation equipment almost always represents a high capital investment to the customer. Thus, it is of significant importance, from a product reliability and performance view point, and from a customer satisfaction and business perspective, to achieve a substantially uniform temperature across the air inlet side of the rack unit.

Figure 2A:
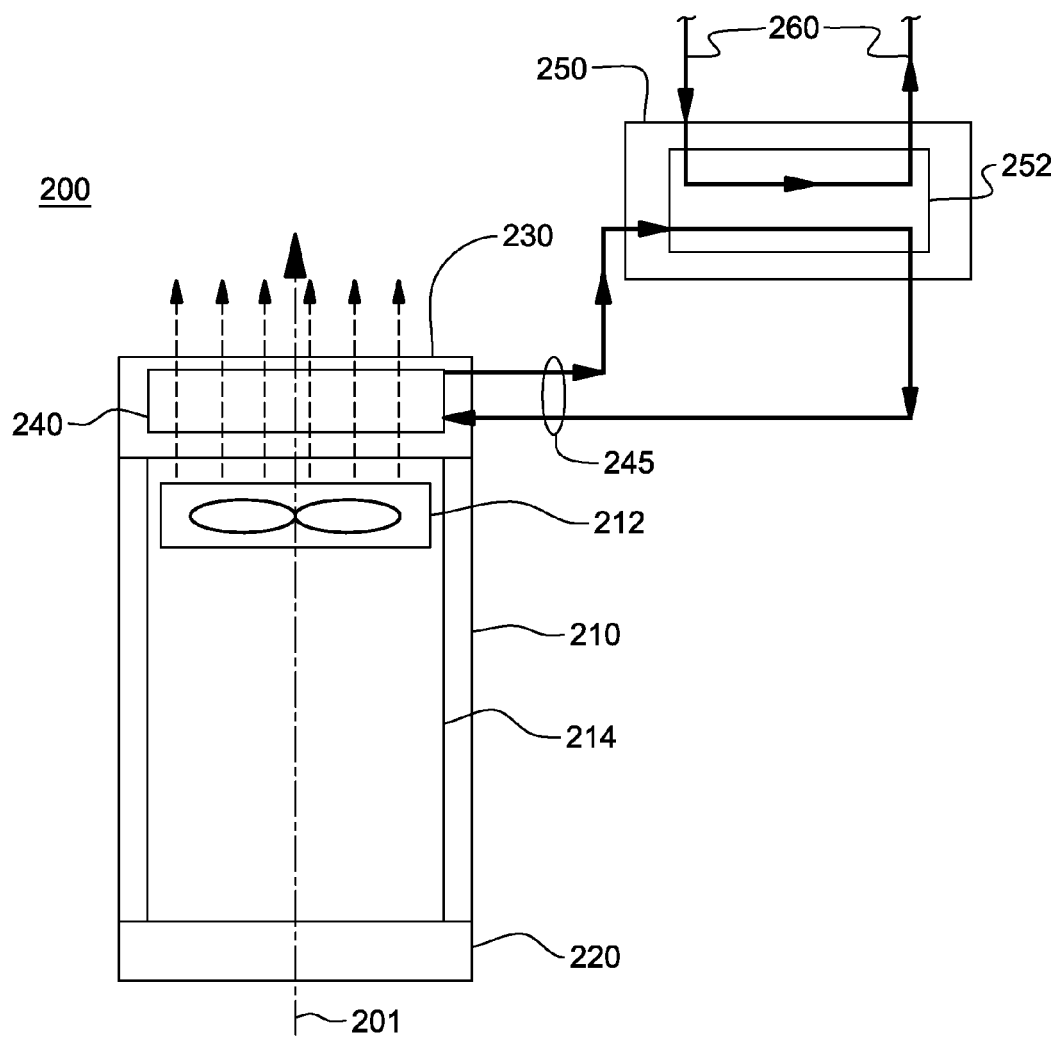
FIG. 2A is a top plan view of one embodiment of an electronics rack with a heat exchanger door mounted to an air outlet side thereof, and with extracted heat being rejected to facility coolant via a coolant distribution unit, in accordance with one or more aspects of the present invention.
Figure 2B:
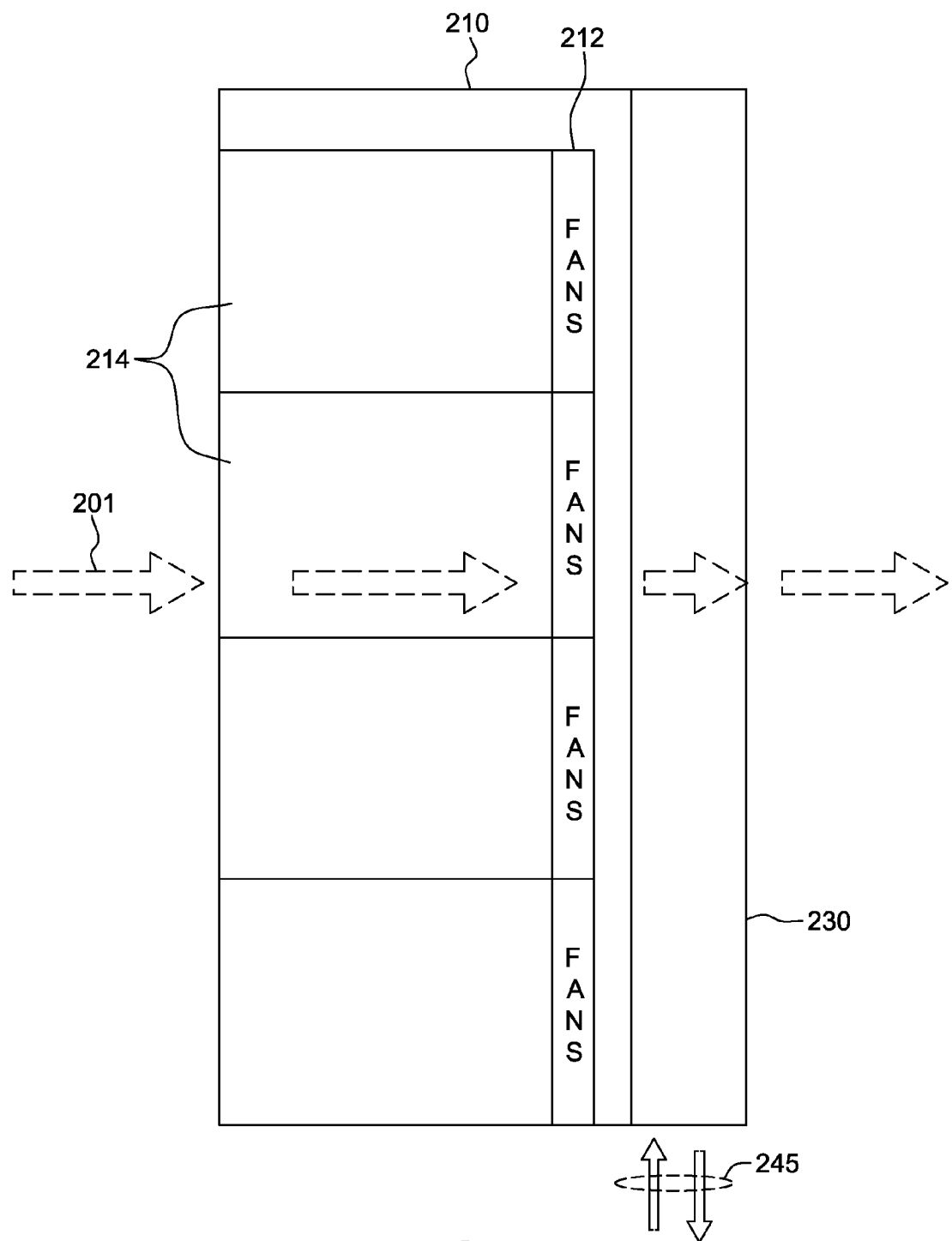
FIG. 2B is a side elevational view of the electronics rack and heat exchanger door of FIG. 2A, in accordance with one or more aspects of the present invention.

Referring collectively to FIGS. 2A & 2B, one embodiment of a cooled electronic system, generally denoted 200, is shown, which includes an electronics rack 210 having an inlet door 220 and an outlet door 230. The inlet and outlet doors have openings to allow for the ingress and egress of air 201, respectively, through the air inlet side and air outlet side of electronics rack 210. The system further includes at least one air-moving device 212 for moving air across at least one electronic system or component 214 disposed within the electronics rack. Located within outlet door 230 is an air-to-coolant heat exchanger 240 across which the inlet-to-outlet airflow 201 through the electronics rack passes. As shown in FIG. 2A, a system coolant loop 245 couples air-to-coolant heat exchanger 240 to a coolant distribution unit 250. Coolant distribution unit 250 is used to buffer the air-to-coolant heat exchanger from facility coolant in a facility coolant loop 260. Air-to-coolant heat exchanger 240 removes heat from the exhausted inlet-to-outlet airflow 201 through the electronics rack via circulating system coolant, for rejection in coolant distribution unit 250 to facility coolant in facility coolant loop 260, for example, via a coolant-to-liquid heat exchanger 252 disposed therein. By way of example, such a system is described in U.S. Pat. No. 7,385,810 B2, issued Jun. 10, 2008, and entitled "Apparatus and Method for Facilitating Cooling of an Electronics Rack Employing a Heat Exchange Assembly Mounted to an Outlet Door Cover of the Electronics Rack". This cooling apparatus can advantageously reduce heat load on the existing air-conditioning unit(s) within the data center, and facilitates cooling of electronics racks by cooling (in one embodiment) the air egressing from the electronics rack and thus cooling any air recirculating to the air inlet side thereof.

In one implementation, inlet and outlet coolant manifolds of the door-mounted, air-to-coolant heat exchanger are also mounted within the heat exchanger door and are coupled to coolant supply and return lines disposed, for example, beneath a raised floor. Alternatively, overhead system coolant supply and return lines might be provided for the air-to-coolant heat exchangers. In such an embodiment, system coolant would enter and exit the respective coolant inlet and outlet manifolds from the top of the rack door, for example, using flexible coolant supply and return hoses, which may be at least partially looped and sized to facilitate opening and closing of the heat exchanger door. Additionally, structures may be provided at the ends of the hoses to relive stress at the hose ends, which would result from opening or closing of the door.

FIG. 3 is a plan view of one embodiment of a data center, generally denoted 300, with cooled electronic systems comprising door-mounted, air-to-coolant heat exchangers, such as disclosed herein. Data center 300 includes a plurality of rows of electronics racks 210, each of which includes (by way of example only) an inlet door 220 at the air inlet side, and a hinged heat exchanger door 230 at the air outlet side, such as described above in connection with the embodiment of FIGS. 2A & 2B. In this embodiment, each heat exchanger door 230 comprises an air-to-coolant heat exchanger and system coolant inlet and outlet manifolds. Multiple coolant conditioning units 250, which function in part as coolant pumping units, are disposed within the data center, for instance, along with one or more air-conditioning units, such as shown in FIG. 1A. By way of example only, each pumping unit may form a system coolant distribution subsystem with one row of a plurality of electronics racks. Each pumping unit includes a coolant-to-liquid heat exchanger where heat is transferred from a system coolant loop to a facility coolant loop. In operation, chilled facility coolant, such as water, is received via a facility coolant supply line 301, and returned via a facility coolant return line 302. System coolant, such as water, is provided via a system coolant supply manifold 310 extending below the respective row of electronics racks, and is returned via a system coolant return manifold 320 also extending below the respective row of electronics racks. In one embodiment, the system coolant supply and return manifolds 310, 320 are hard-plumbed within the data center, for example, within an air supply plenum of the data center, and may be preconfigured to align under and include branch lines (or hoses) extending towards the electronics racks in a respective row of racks.

Figure 4:
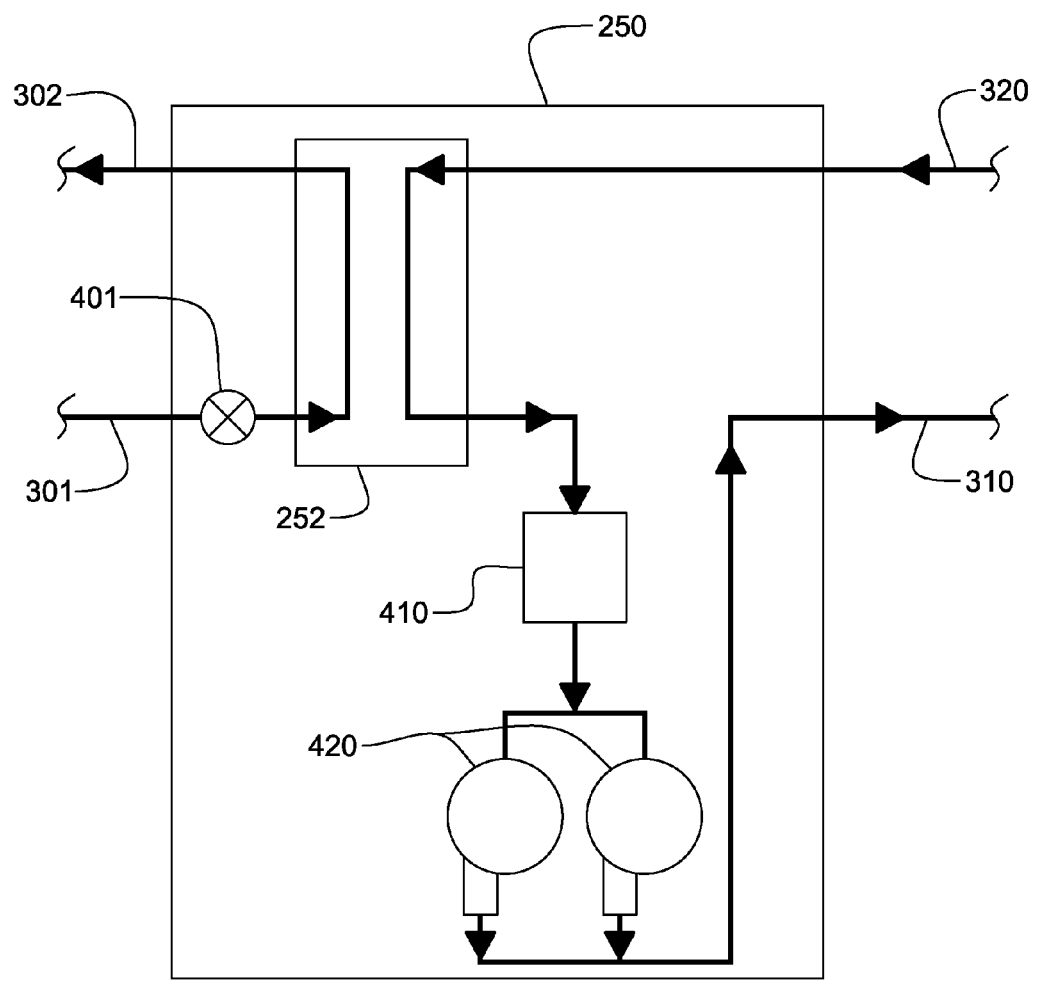
FIG. 4 is a schematic of one embodiment of a coolant distribution unit which may be employed (in one embodiment) in association with an air-cooling apparatus, or a hybrid air-cooling and vapor-condensing apparatus, in accordance with one or more aspects of the present invention.

FIG. 4 depicts one embodiment of a coolant distribution unit 250 for (for example) a data center such as depicted in FIG. 3. Liquid-to-liquid heat exchanger 252 cools system coolant passing through the system coolant loop (comprising system coolant supply header 310 and system coolant return header 320). In one embodiment, the system coolant has undergone heating (and possibly partial vaporization) within the respective air-to-liquid heat exchangers disposed within the outlet doors of the electronics racks. The facility coolant loop coupled to liquid-to-liquid heat exchanger 252 comprises facility coolant supply line 301 and facility coolant return line 302, which in one embodiment, provide chilled facility water to the liquid-to-liquid heat exchanger. A control valve 401 may be employed in facility coolant supply line 301 to control facility coolant flow rate through the liquid-to-liquid heat exchanger 252. After the system coolant cools within liquid-to-liquid heat exchanger 252, the coolant is collected in a reservoir 410 for pumping via a redundant pump assembly 420 back to the respective row of electronics racks via system coolant supply header 310.

The American Society of Heating Refrigeration and Air-Conditioning Engineers (ASHRAE) published ASHRAE 2011 Environmental Standards for electronics racks (such as IT equipment), wherein two new environmental envelopes were created to assist in improving data center efficiency, and reducing energy consumption in comparison with maintaining the narrower environmental envelopes previously specified. The two new standards are referred to as the A3 Class and A4 Class, which allow air temperatures entering the IT equipment to be as high as 40° C., and 45° C., respectively. Currently, most electronics rack (or IT equipment) are instead designed for the A2 environment, where the air inlet temperature has a maximum 35° C., as discussed above.

To take advantage of the new ASHRAE standards, one solution is to redesign the equipment so that the higher inlet air temperatures could be tolerated. This could be accomplished by providing more heat exchange surfaces within the rack, increasing airflow through the rack by ramping up the rack's air-moving devices, or even adding liquid-cooling to the electronics rack. However, such solutions are not always practical, or would require additional time to develop, and would delay the use of the rack in a higher temperature A3 or A4 environment. Additionally, some components within the electronics rack (such as high-density, hard disk drives) often cannot have extended surfaces and cannot be liquid-cooled. Certain electronic components may also show an increase in failure rates as the air temperature rises, which is often unacceptable. Tape-based storage racks also suffer at higher temperatures, at least in part, due to the increased aging and stress on the polymer tape media.

An alternate solution to these issues, particularly for electronics racks comprising high-performance, graphics-processing units (GPUs), hard disk drives (HDD) or tape-based computer storage (i.e., tape media), is to reduce the air inlet temperature at the air inlet side of the electronics rack. This might be achieved by adding a heat exchanger door, such as described above, to the air inlet side of the rack to pre-cool the air from, for instance, 40° C. to 35° C., or lower. However, a rear door heat exchanger such as described above may be expensive, and heavy, and could be designed to extract a large heat load, which makes it unsuitable for wide adoption, especially in cases where only a small temperature reduction in the air inlet temperature is required. For these reasons, described below is a new air-inlet-cooling door assembly which utilizes reduced materials compared with the larger rear door heat exchanger approach, is lighter, and more cost effective. Additionally, the door assembly designs disclosed herein facilitate redistributing cooled air from smaller and/or segmented airflow openings or heat exchangers to, for instance, desired locations at the air inlet side (e.g., front face) of the electronics rack.

Generally stated, disclosed herein is a cooling apparatus, comprising a door assembly that is configured to couple to an electronics rack at, or adjacent to, an air inlet side of an electronics rack. The door assembly facilitates cooling of airflow into the electronics rack, and thereby, cooling of one or more air-cooled electronic components of the electronics rack. The door assembly comprises, for instance: one or more airflow openings facilitating passage of airflow through the door assembly and into the electronics rack; one or more air-to-coolant heat exchangers disposed so that airflow through the airflow opening(s) passes across the air-to-coolant heat exchanger(s), the air-to-coolant heat exchanger(s) being configured to attract heat from the airflow passing thereacross; and one or more airflow redistributors disposed in an airflow direction downstream of, and at least partially aligned to, the air-to-coolant heat exchanger(s). The airflow redistributor(s) facilitates, at least partially, redistributing of the airflow passing across the air-to-liquid heat exchanger(s), before reaching the air inlet side of the electronics rack. In this manner, the airflow redistributor(s) facilitates providing a desired airflow pattern at the air inlet side of the electronics rack, notwithstanding that the airflow opening(s), as well as the air-to-coolant heat exchanger(s), are smaller in transverse cross-sectional area to the direction of airflow than the transverse cross-sectional area to the direction of airflow of the air inlet side of the electronics rack. In one implementation, the airflow redistributor(s) is configured to facilitate providing a uniform airflow distribution across the air inlet side of the electronics rack.

As described herein, in one aspect, one or more smaller (e.g., segmented or narrowed) airflow openings and air-to-liquid heat exchangers are disposed in association with one or more airflow redistributors (such as gratings or vanes) to help redistribute airflow passing across the air-to-coolant heat exchangers from the smaller airflow opening(s) of the door assembly to a desired airflow pattern at the air inlet side (e.g., front face) of the electronics rack. The use of one or more smaller airflow openings and associated air-to-liquid heat exchangers (or heat exchanger sections) reduces the material, and thus the weight and cost of the door assembly, making it more affordable, and more likely to be accepted in the marketplace. Additionally, providing one or more smaller airflow openings into the door assembly increases the airflow velocities across the associated heat exchanger(s). The door assemblies disclosed herein are suitable for use with lower heat load extraction, such as in pre-cooling of air-entering an electronics rack, where other conventional solutions would be more expensive, and not always appropriate. The solution disclosed below is advantageous for electronic subsystems where higher inlet temperatures are not practical, or possible (e.g., due to limitations in the media), or there is a need to maintain higher performance or higher reliability.

Figure 5:
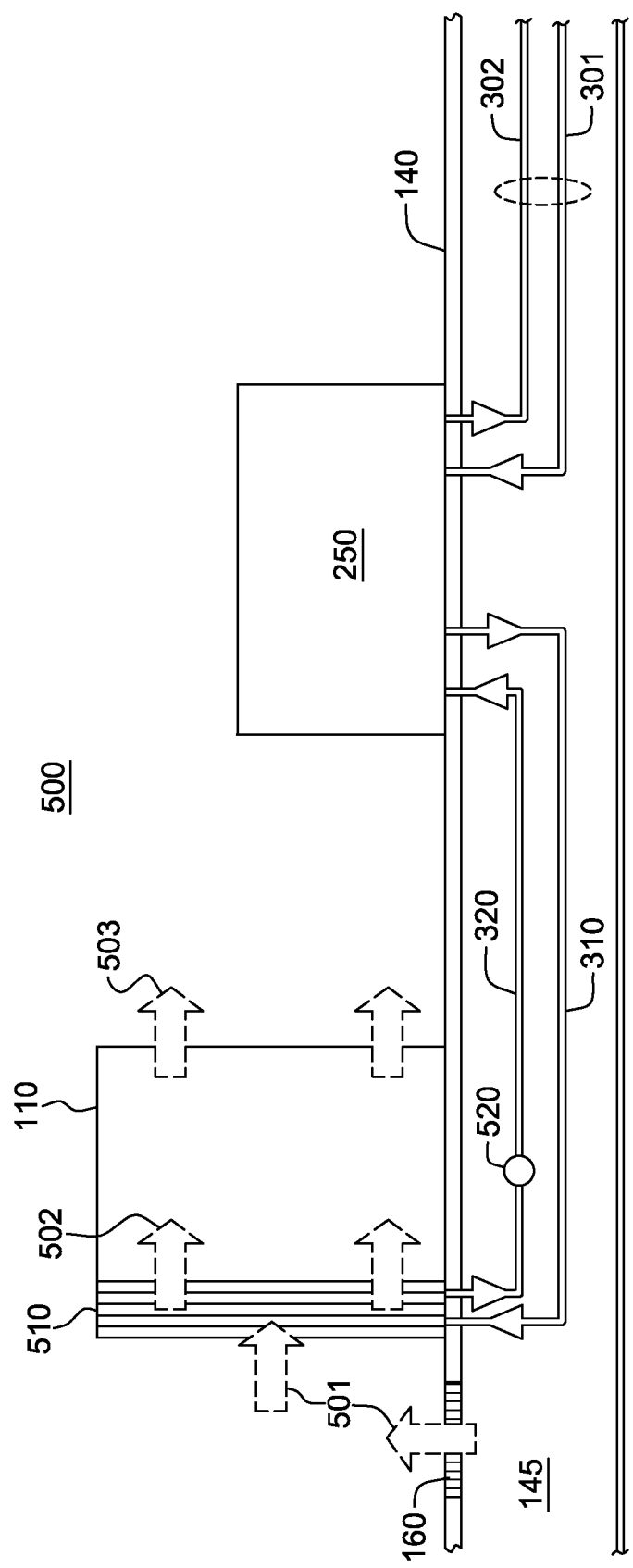
FIG. 5 depicts one embodiment of a data center implementing another cooling approach, wherein an electronics rack is provided with an inlet-air-cooling door assembly disposed at the air inlet side thereof, in accordance with one or more aspects of the present invention.

FIG. 5 depicts one embodiment of a data center, generally denoted 500, comprising one or more electronics racks 110, and one or more coolant distribution units 250 disposed, in the illustrated example, on a raised floor 140 of the data center. In actual implementation, the data center 500 may comprise a plurality of electronics racks 110, as well as multiple coolant-distribution units, and one or more computer room air-conditioning units (not shown). In this implementation, a door assembly 510 is provided disposed at the air inlet side of electronics rack 110 to facilitate cooling of ingressing airflow 501 to reduce temperature of the airflow 502 entering electronics rack 110, and thereby cooling of the air-cooled electronic components within the rack. Heated exhaust air 503 exits the air outlet side of the electronics rack 110, as described above. Cooled air 501 may be provided, in one embodiment, through one or more perforated floor tiles 160, with conditioned and cooled air being supplied to plenum 145 by one or more air-conditioning units (not shown).

As explained above, the coolant distribution unit 250 comprises, for instance, a pumping unit which includes a coolant-to-liquid heat exchanger, where heat is transferred from a system coolant loop to a facility coolant loop. For example, in operation, chilled facility coolant, such as water, is received via facility coolant supply line 301, and returned via facility coolant return line 302. System coolant, such as water, is provided via a system coolant supply manifold 310, and is returned via a system coolant return manifold 320. In one embodiment, the system coolant supply and return manifolds 310, 320 may be hard-plumbed within the data center, for instance, within air supply plenum 145, such as illustrated in FIG. 5, and may be pre-configured to align under and include branch lines (or hoses) extending towards the electronics racks in a respective row of racks. One or more flow control valves 520 may be associated with, for instance, system coolant return manifold 320, to facilitate control of system coolant flow through the associated cooling door assemblies 510. As noted, door assembly 510 is configured to be disposed at the air inlet side of the electronics rack, and may be an inlet-air-cooling door assembly configured to provide cooled air that meets a specified ASHRAE standard, for instance, an air temperature of 35° C. (i.e, the A2 ASHRAE standard), or lower. Heat extracted by the one or more air-to-coolant heat exchangers of the door assembly is rejected to (in this embodiment) the system coolant, which is transferred via the one or more coolant distribution units to the facility coolant, and subsequently dissipated via chillers, and cooling towers, or via dry-coolers or other liquid-side economizers.

FIGS. 6A-6C depict one embodiment of a door assembly 510. Referring collectively to FIGS. 6A-6C, door assembly 510 includes, in this embodiment, an outer shell 600 which includes a trapezoidal-shaped shell portion 601 with an apex 602 at the front face of the outer shell. Within apex 602, an airflow opening 610 is provided, along with an air-to-coolant heat exchanger 620. As illustrated, air-to-coolant heat exchanger 620 is disposed within the airflow opening 610 so that airflow through airflow opening 610 passes across the air-to-coolant heat exchanger 620. As illustrated in FIGS. 6A-6C, airflow opening 610 and associated air-to-liquid heat exchanger 620 have a smaller transverse cross-sectional area $(SA_1)$ to the direction of airflow than a transverse cross-sectional area $(SA_2)$ to the direction of airflow of the air inlet side of the electronics rack, which is assumed to be the same size as the back side of door assembly 510. Note that, in one embodiment, the outer shell 600 is a solid surface shell so that airflow 501 entering airflow opening 610 necessarily passes across the air-to-liquid heat exchanger 620, and egresses as cooled air 502 at the back side of the door assembly, for ingress into the air inlet side of the electronics rack (not shown) without escaping.

In the depicted embodiment, air-to-coolant heat exchanger 620 receives coolant via a coolant supply manifold 621 and a coolant return manifold 622, which are disposed horizontally within the door assembly. System coolant flows into and from the supply and return manifolds 621, 622 via, for instance, flexible hoses 625, 626, which are coupled via quick connects 627, 628 to the data center's system coolant supply manifold and system coolant return manifold (see FIG. 5). The air-to-coolant heat exchanger 620 includes, in this embodiment, a plurality of coolant-carrying tubes 623 coupled at respective ends in fluid communication with coolant supply manifold 621, and coolant return manifold 622. In addition, a plurality of thermally conductive fins 624 are provided in thermal or mechanical contact with the plurality of coolant-carrying tubes 623. A bleed port 629 may also be provided, for instance, in the system coolant manifolds 621, 622 to facilitate bleeding off air from the manifolds or heat exchanger.

As illustrated in FIGS. 6A & 6C, the door assembly also includes an airflow redistributor 630, which comprises, in this embodiment, a plurality of airflow openings 631. The airflow distributor may be fabricated, for instance, as a plate, screen, etc., sized and configured to redistribute airflow 501 passing through airflow opening 610 and across air-to-coolant heat exchanger 620 to, for instance, a desired airflow pattern 502 egressing from door assembly 510, and into the air inlet side of the electronics rack (see FIG. 5). In the depicted embodiment, the airflow redistributor 630 is positioned, sized and configured, along with the plurality of airflow openings 631, to facilitate a substantially uniform distribution of airflow across the height and width of the door assembly, and therefore, across the height and width of the air inlet side of the electronics rack. As illustrated in FIG. 6C, a certain portion of the airflow 635 gets redirected (upon encountering the airflow redistributor) around the airflow redistributor 630, and thus, the airflow redistributor facilitates (in this embodiment) outwardly expanding the airflow from the smaller airflow opening 610 of the door assembly 510 to the larger air inlet side of the electronics rack. Note that in the embodiment depicted, a plurality of mounting brackets 640 may be provided to hold airflow redistributor 630 aligned in position downstream of airflow opening 610 and air-to-coolant heat exchanger 620.

Note that in the door assembly embodiment of FIGS. 6A-6C, airflow opening 610, and air-to-coolant heat exchanger 620 are smaller than the back side of the door, which is assumed to approximately match the height and width of the air inlet side of the electronics rack to which the door assembly mounts. The smaller opening allows, in this design, for system coolant supply and return manifolds 621, 622 to be mounted horizontally within the door, as well as for the use of a smaller heat exchanger, thereby reducing the weight and cost of the door assembly. To help redistribute the incoming airflow, for example, uniformly across the front face of the electronics rack, the airflow redistributor is mounted behind and downstream of the heat exchanger, for instance, a set distance in front of the air inlet side of the electronics rack, when the door assembly is mounted to the rack. This airflow redistributor 630 acts, in part, as a flow impedance structure, and helps redistribute the airflow into a desired pattern at the air inlet side of the rack. The size of the airflow redistributor, the distance of the redistributor to the air inlet side of the rack, and the percentage of openings within the redistributor, may all be numerically determined through, for instance, airflow simulations, and might depend, at least in part, on the specific electronic components, subsystems, and air-moving devices within the rack.

Figure 7B:
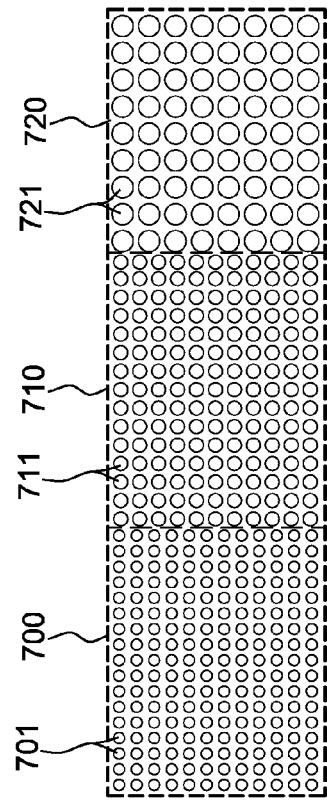
FIG. 7B is a partial enlargement of the airflow redistributor of FIG. 7A, showing multiple regions of airflow openings of different diameters, in accordance with one or more aspects of the present invention.
Figure 7C:
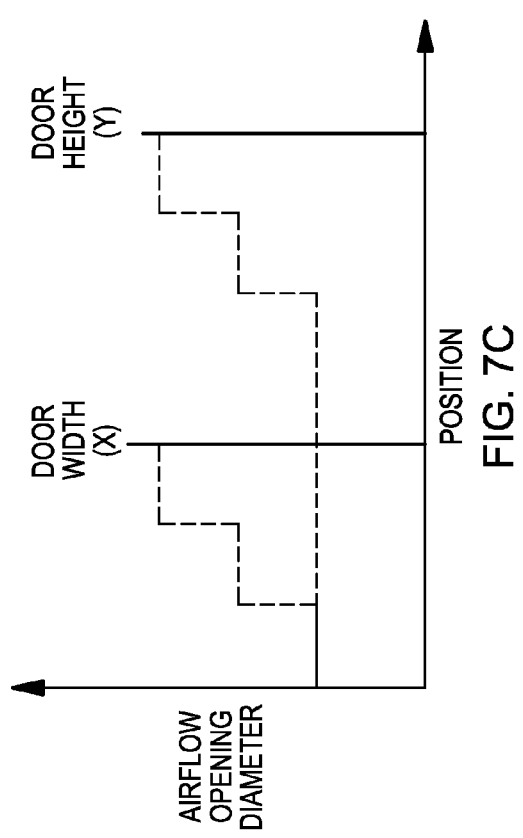
FIG. 7C is a graph of airflow opening diameter versus opening position from center, in both an x direction and a y direction for one embodiment of the airflow redistributor of FIGS. 7A & 7B, in accordance with one or more aspects of the present invention.
Figure 7A:
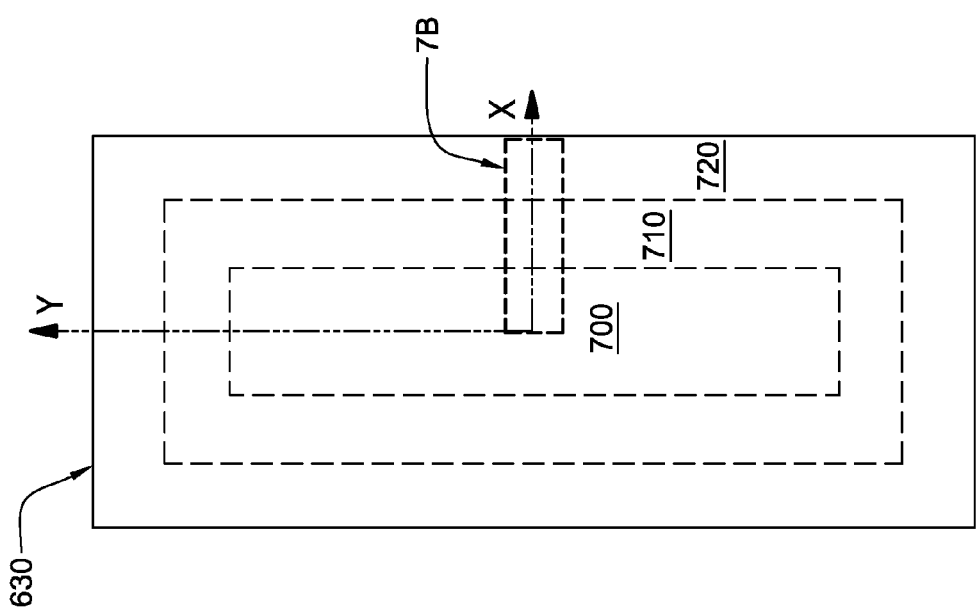
FIG. 7A is an elevational view of one embodiment of an airflow redistributor for an inlet-air-cooling door assembly, in accordance with one or more aspects of the present invention.

FIGS. 7A-7C depict in greater detail one embodiment of an airflow redistributor 630, in accordance with one or more aspects of the present invention. In this embodiment, airflow redistributor 630 comprises a plurality of different regions 700, 710, 720, each of which comprises a plurality of openings 701, 711, 721. As illustrated in FIG. 7B, in one implementation, the plurality of openings 701, 711, 721 are differently-sized, for instance, having different diameters, between the different regions 700, 710, 720. In addition, the size of the airflow openings generally increases from the center region 700 outwards to the outer, peripheral region 720. In this manner, airflow crossing the air-to-coolant heat exchanger 620 (FIGS. 6A-6C) is redistributed, at least partially, outwards, and even around, the airflow redistributor, as illustrated in FIG. 6C and discussed above. The smaller airflow openings 701 (or pores) in central region 700 define a higher airflow resistance region of the airflow redistributor. Due (in this embodiment) to the larger vertical height of the door assembly than width, the airflow redirector 630 is larger vertically, that is, in they direction, than horizontally (in the x direction). As such, the FIG. 7C plot of airflow opening diameter versus location within the airflow distributor, shows that the airflow openings remaining smaller for a longer distance from center in the vertical direction, than in the horizontal direction, which is also illustrated in the elevational view of FIG. 7A. Region 710 presents a medium airflow resistance region, and airflow region 720 defines a lower airflow resistance region. Thus, the airflow redistributor, in this example, is a grating or plate with different-sized openings (and variable percentage openings) across the different regions. Note that three airflow regions are illustrated in FIGS. 7A-7C by way of example only. Redistribution of airflow can be accomplished using any number of airflow redistribution regions. Also, note that in one embodiment, a goal of the airflow redistributor is to redistribute airflow exiting from across the air-to-coolant heat exchanger into a desired airflow pattern for ingress to the air inlet side of the rack. As such, any airflow redistributor which has, for instance, varying airflow resistance across the face of the redistributor, can be employed to accomplish this function.

FIGS. 8A-8C depict an alternate airflow redistributor 630' configuration, wherein airflow openings 810 vary more uniformly in size from a center 800 outwards to a first peripheral edge 801 and a second peripheral edge 802. The smallest airflow openings (or pores) represent a higher flow resistance, closer to the center of the airflow redistributor, and the larger airflow openings (or pores) near the peripheries 801, 802 present a lower airflow resistance, with the airflow resistance changing, for example, approximately linearly, from the center to the outer periphery, in the x direction and in they direction. This is illustrated by the graph of FIG. 8C. In FIG. 8C, airflow opening diameter is shown to increase more rapidly in the x direction, than in the y direction, which is due to the different lengths in the x direction and the y direction of the airflow redistributor, as depicted in FIG. 8A.

Note that the particular airflow redistributors of FIGS. 7A-8C are presented by way of example only. Other airflow redistributors may also (or alternatively) be employed. A goal of the airflow redistributor, in the embodiments depicted, is to present a varying airflow resistance so as to shape, or redistribute the airflow within the door assembly to a desired airflow pattern exiting the door assembly. This desired airflow pattern may comprise, for instance, a uniform airflow pattern across the face of the air inlet side of the rack; that is, exiting across the width and height of the rack. Other patterns may alternatively be obtained, however. For example, in one or more implementations, greater airflow may be desired in an upper or lower region of the electronics rack compared with the other region, depending in part on the location within the rack of the electronics components to be cooled.

FIGS. 9A-9D depict an alternate door assembly embodiment, generally denoted 900, in accordance with one or more aspects of the present invention. Referring collectively to FIGS. 9A-9D, this embodiment is similar to that described above in connection with FIGS. 6A-6C, however, multiple airflow openings 910 are provided within the door assembly 900, for instance, at apex 902 of a trapezoidal-shaped outer shell portion 901 of the door assembly 900. The multiple openings 910 have associated therewith multiple air-to-coolant heat exchangers (or heat exchange sections) 920, as well as multiple airflow redistributors 930. The air-to-coolant heat exchangers 920 are disposed so that airflow through the respective airflow openings 910 passes across the associated heat exchanger 920, and the heat exchanger is configured to extract heat from the airflow passing thereacross. In this embodiment, door assembly 900 includes a system coolant supply manifold 921 and a system coolant return manifold 922 disposed vertically within the door assembly, as illustrated in FIG. 9B. These manifolds provide system coolant flow through coolant-carrying tubes 923 of the heat exchangers 920. The heat exchangers 920 further include a plurality of thermally conductive fins 924 that are thermally or mechanically coupled to the respective coolant-carrying tubes 923 to facilitate transfer of heat from the airflow passing through the respective airflow opening 910 to the coolant (e.g., system coolant) flowing through the air-to-liquid heat exchangers 920. Respective flexible hoses 925, 926 facilitate coupling the system coolant supply manifold 921, and system coolant return manifold 922 (via, for instance, quick connects 927, 928) with the data center system coolant supply manifold and system coolant return manifold, discussed above. Note that the flexible hoses 925, 926 may be sized and of sufficient flexibility to allow for the door assembly to be rotated open and away from the electronics rack (not shown), for instance, if the door assembly is hinged-mounted to the electronics rack.

As with the embodiments discussed above in connection with FIGS. 6A-8C, airflow redistributors 930 may comprise a plurality of airflow openings 931, which may be of the same or varying size, depending upon the implementation. The airflow redistributors 930 of door assembly 900 align, at least partially, with the respective airflow openings 910, and air-to-coolant heat exchangers 920 disposed within or aligned to the openings 910. As illustrated, in operation, a portion 502' of the cooled airflow passing across the respective air-to-coolant heat exchangers 920 flows around the downstream airflow redistributors 930, and thus is redistributed (for example, is moved outwardly from a projection of the respective airflow opening) before passing from the door assembly to the electronics rack. This redistribution may be provided, in one embodiment, to facilitate a more uniform airflow distribution across the air inlet side of the rack, notwithstanding the use of smaller airflow openings and smaller heat exchangers within the door assembly. Ducting 950 may also be provided to facilitate the redirection or redistribution of airflow, as well as to prevent any recirculation of airflow within the door assembly. In one embodiment, ducting 950 may comprise panels, such as plastic panels. The airflow redistributors 930 depicted in FIGS. 9A-9D may comprise, for instance, any plate-type or screen-type redistributor, for instance, with varying flow impedances, as discussed above in connection with FIGS. 7A-8C.

Note that using multiple smaller airflow openings 910 and smaller heat exchangers 920 helps to reduce the material within, and cost of door assembly 900. The door assembly of FIGS. 9A-9D does, however, result in comparatively larger vertical manifolds 921, 922 as compared with the shorter, horizontal manifolds 621, 622 employed in the embodiment of FIGS. 6A-6C. As discussed above, the sizing and configuration of the airflow redistributors may be based, for instance, on numerical airflow redistribution simulations, which can be performed by one of ordinary skill in the art to achieve a desired pattern, such as a uniform pattern, at the back side of the door assembly and/or at the air inlet side of the electronics rack. Note also that, in the embodiment depicted, a plurality of mounting brackets 940 may be provided to hold airflow redistributor 930, aligned and positioned downstream of airflow opening 910 and air-to-coolant heat exchanger 920.

FIGS. 10A-10E depict a further embodiment of a door assembly, generally denoted 1000, in accordance with one or more aspects of the present invention. Referring collectively to FIGS. 10A-10E, this door assembly is similar to that described above in connection with FIGS. 9A-9D, with the exception being that the airflow redistributors 930 of the embodiment of FIGS. 9A-9D are replaced by respective airflow redistributors that comprise sets of nested airflow guiding vanes 1030. Each set of nested airflow guiding vanes 1030 may be coupled to a respective airflow opening 910 of the door assembly, so that substantially all airflow 501 ingressing through the airflow openings 910 passes through the sets of nested airflow guiding vanes.

FIGS. 10D & 10E illustrate an enlarged view of one embodiment of a set of nested airflow guiding vanes 1030. In this embodiment, a plurality of airflow guiding vanes 1032 are provided, between which airflow openings 1031 are defined. These airflow openings 1031 vary in size, from a smallest opening in the center of the set of nested airflow guiding vanes 1030, to a largest opening at the outer region of the airflow redistributor.

Note that in the embodiment of FIGS. 10A-10E, airflow through the different ducts defined by the airflow guiding vanes 1030 may be different, but the airflow-per-unit area may be the same, for instance, where it is desired that a uniform airflow be presented to the air inlet side of the electronics rack. In this embodiment, the sets of nested airflow guiding vanes 1030 would extend horizontally and vertically across the back of the door assembly, so as to match, in one embodiment, the width and height of the air inlet side of the electronics rack. Thus, substantially all airflow through the smaller airflow openings 910 of the door assembly 1000 would be redistributed to the larger opening at the air inlet side of the rack. One or more ribs 1035 may be provided within each set of nested airflow guiding vanes 1030 to connect or hold the pyramid-shaped airflow guiding vanes together in a single structure. The gradually-outwardly-increasing openings 1031 facilitate redistributing, in one embodiment, airflow from the smaller airflow openings 910 substantially equally outward. The exact dimensions of the airflow vanes may be determined, as in the above embodiments, from numerical simulation, which may be performed by one of ordinary skill in the art.

Note that in the embodiments of the door assembly discussed herein, the heat exchanger fins may be made of a thermally conductive material, such as aluminum, while the coolant-carrying tubes (or coils) may be made of, for instance, copper. The system coolant manifolds may also be made of copper, with the tubes then brazed at the intersections to provide leak-free connections. Connections to the system coolant loop, in the case of a coolant distribution unit, or to the facility coolant loop (if facility coolant is flowing directly through the heat exchangers) may be made via standard quick connects. To reduce weight and cost, the manifolds could alternatively be made of polymer, such as PVC, with the joints to the copper tubes being soldered or epoxyed. Alternatively, quick connects could also be used to increase the reparability of the overall assembly. The airflow redistributors, whether plates, grills, screens, vanes, etc., may be made with, for instance, sheet metal, aluminum, or plastic, and chosen based on the most cost effective solution for a particular implementation.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to explain the principles of the invention and the practical application, and to enable others of ordinary skill in the art to understand the invention through various embodiments and the various modifications thereto which are dependent on the particular use contemplated.

What is claimed is:

1. A method comprising:
   providing a cooling apparatus comprising a door assembly sized to couple to an electronics rack at an air inlet side of the electronics rack, wherein air moves through the electronics rack from the air inlet side to an air outlet side thereof, the door assembly facilitating air-cooling of one or more electronic components of the electronics rack, and wherein the door assembly comprises:
     at least one airflow opening facilitating passage of airflow through the door assembly and into the electronics rack with the door assembly coupled to the electronics rack;
     at least one air-to-coolant heat exchanger disposed so that the airflow through the at least one airflow opening passes across the at least one air-to-coolant heat exchanger, the at least one air-to-coolant heat exchanger extracting heat from the airflow passing thereacross; and at least one airflow redistributor, the at least one airflow redistributor being part of the door assembly; and being distinct from and spaced from the at least one air-to-coolant heat exchanger, and being disposed within the door assembly in an airflow direction donwstream of, and at least partially aligned to, the at least one air-to-coolant heat exchanger, wherein with the door assembly coupled to the electronics rack at the air inlet side thereof, the at least one airflow redistributor, at least partially, redistributing within the door assembly the airflow passing across the at least one air-to-coolant heat exchanger, and before reaching the air inlet side of the electronics rack.

2. The method of claim 1, wherein one airflow opening of the at least one airflow opening has a smaller transverse cross-sectional area to the direction of airflow than a transverse cross-sectional area to the direction of airflow of the air inlet side of the electronics rack.

3. The method of claim 2, wherein the door assembly comprises a trapezoidal-shaped, outer shell portion, and wherein the one airflow opening of the at least one airflow opening is disposed at an apex of the trapezoidal-shaped, outer shell portion.

4. The method of claim 1, wherein the at least one airflow redistributor is configured to at least partially redistribute the airflow after passing across the at least one air-to-coolant heat exchanger to facilitate providing a desired airflow pattern at the air inlet side of the electronics rack.

5. The method of claim 1, wherein the at least one airflow redistributor at least partially, outwardly redistributes the airflow in a direction transverse to a direction of the airflow across the at least one air-to-coolant heat exchanger, after the airflow passing across the at least one air-to-coolant heat exchanger to facilitate providing a uniform airflow distribution across the air inlet side of the electronics rack.

6. The method of claim 1, wherein the at least one airflow redistributor comprises at least one airflow redistribution grating, the at least one airflow redistribution grating comprising a plurality of airflow openings which allow at least a portion of the airflow to pass therethrough.

7. The method of claim 6, wherein the at least one airflow redistribution grating has a smaller transverse cross-sectional area to the direction of airflow than a transverse cross-sectional area to the direction of airflow of the air inlet side of the electronics rack.

8. The method of claim 6, wherein airflow openings of the plurality of airflow openings of the at least one airflow distribution grating vary in size.

9. The method of claim 8, wherein the at least one airflow redistribution grating comprises multiple regions of airflow openings, and wherein different regions of the multiple regions of airflow openings comprise differently-sized airflow openings.

10. The method of claim 8, wherein airflow openings of the at least one airflow redistribution grating increase in size in at least one direction from a center of the at least one airflow redistribution grating, outwards towards a periphery of the at least one airflow redistribution grating.

11. The method of claim 1, wherein the at least one airflow redistributor comprises at least one set of nested airflow guiding vanes, the at least one set of nested airflow guiding vanes at least partially redirecting the airflow passing across the at least one air-to-coolant heat exchanger to facilitate providing a desired airflow pattern at the air inlet side of the electronics rack.

12. The method of claim 11, wherein the set of nested airflow guiding vanes comprise a plurality of airflow openings, and wherein airflow openings of the plurality of airflow openings increase in size from a center of the set of nested airflow guiding vanes towards a periphery of the set of nested airflow guiding vanes.

13. The method of claim 1, wherein the door assembly comprises:
multiple airflow openings facilitating passage of airflow through the door assembly and into the electronics rack;
multiple air-to-coolant heat exchangers, each air-to-coolant heat exchanger being disposed so that airflow through a respective airflow opening of the multiple airflow openings passes across the air-to-coolant heat exchanger, the multiple air-to-coolant heat exchangers extracting heat from the airflow passing thereacross; and
multiple airflow redistributors disposed in an airflow direction downstream of, and at least partially aligned to, the multiple air-to-coolant heat exchangers, the multiple airflow redistributors facilitating, at least partially, redistribution of the airflow passing across the multiple air-to-coolant heat exchangers, before reaching the air inlet side of the electronics rack.

* * * * *